United States Patent
Hatakeyama

(10) Patent No.: US 8,669,561 B2
(45) Date of Patent: Mar. 11, 2014

(54) HIGH-VOLTAGE SEMICONDUCTOR DEVICE

(75) Inventor: Tetsuo Hatakeyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/227,032

(22) Filed: Sep. 7, 2011

(65) Prior Publication Data

US 2012/0228633 A1    Sep. 13, 2012

(30) Foreign Application Priority Data

Mar. 10, 2011  (JP) ................. 2011-052789

(51) Int. Cl.
*H01L 31/0312* (2006.01)

(52) U.S. Cl.
USPC .................... 257/77; 257/E29.084

(58) Field of Classification Search
USPC ........................... 257/77, E29.084
See application file for complete search history.

(56) References Cited

U.S. PATENT DOCUMENTS

| | | | | | |
|---|---|---|---|---|---|
| 4,573,066 | A | * | 2/1986 | Whight | 257/495 |
| 5,028,548 | A | * | 7/1991 | Nguyen | 438/488 |
| 5,994,754 | A | * | 11/1999 | Hayashi et al. | 257/495 |
| 6,831,345 | B2 | * | 12/2004 | Kinoshita et al. | 257/492 |
| 7,649,213 | B2 | | 1/2010 | Hatakeyama et al. | |
| 2006/0065899 | A1 | * | 3/2006 | Hatakeyama et al. | 257/77 |
| 2009/0212301 | A1 | * | 8/2009 | Zhang et al. | 257/77 |
| 2010/0320476 | A1 | * | 12/2010 | Cheng et al. | 257/77 |
| 2011/0220913 | A1 | * | 9/2011 | Hatakeyama | 257/77 |
| 2012/0056197 | A1 | * | 3/2012 | Mizukami et al. | 257/77 |

FOREIGN PATENT DOCUMENTS

| | | | |
|---|---|---|---|
| JP | 2006-100593 A | | 4/2006 |
| JP | 2008-16461 A | | 1/2008 |
| JP | 2008-034646 | * | 2/2008 .............. H01L 29/47 |
| JP | 2008-34646 | | 2/2008 |
| JP | 5072991 B2 | | 11/2012 |

OTHER PUBLICATIONS

Tetsuo Hatakeyama, "Measurements of impact ionization coefficients of electrons and holes in 4H-SiC and their application to device simulation", Physica Status Solidi A 206, No. 10, 2009, pp. 2284-2294.
U.S. Appl. No. 12/876,713, filed Sep. 7, 2010, Tetsuo Hatakeyama.
Office Action issued Feb. 19, 2013 in Japanese Patent Application No. 2011-052789 with English language translation.
Office Action mailed Dec. 3, 2013 in Japanese Patent Application No. 2011-052789, filed Mar. 10, 2011 (with English-language translation).

* cited by examiner

*Primary Examiner* — David S Blum
(74) *Attorney, Agent, or Firm* — Oblon, Spivak, McClelland, Maier & Neustadt, L.L.P.

(57) ABSTRACT

A semiconductor device includes: a semiconductor substrate; a first conductivity type semiconductor layer that is formed on the substrate and is made of silicon carbide; an active area formed on a surface of the semiconductor layer; a first semiconductor area of a second conductivity type formed on the surface of the semiconductor layer to surround the active area; a second semiconductor area, provided to adjoin an outer side of the first semiconductor area on the surface of the semiconductor layer and surround the first semiconductor area, in which a second conductivity type impurity area having the same impurity concentration and the same depth as those of the first semiconductor area is formed in a mesh shape; a first electrode provided on the active area; and a second electrode provided on the rear surface of the semiconductor substrate.

14 Claims, 11 Drawing Sheets

HIGH-VOLTAGE SEMICONDUCTOR DEVICE

CROSS-REFERENCE TO RELATED APPLICATION

This application is based upon and claims the benefit of priority from the prior Japanese Patent application No. JP 2011-052789, filed on Mar. 10, 2011; the entire contents of which are incorporated herein by reference.

FIELD

Embodiments described herein relate to a semiconductor device using a silicon carbide substrate, such as a Schottky barrier diode, a PN diode, a metal insulator semiconductor field effect transistor (MISFET), and an insulated gate bipolar transistor (IGBT).

BACKGROUND

In semiconductor power devices, the structure and material of devices need to be selected to minimize ON resistance and maximize withstanding voltage. In the related art, the semiconductor power device is manufactured using silicon as a semiconductor material. A site where the electric field is concentrated in a terminal portion of the device has been designed to reduce the electric field using a ring structure of a p⁻ type layer, or a PN junction, which is so-called junction termination extension (JTE)), formed on the surface so as to obtain a high withstanding voltage.

In the related art, a high withstanding voltage is obtained, for example, by minimizing the ON-voltage of the Schottky barrier diode and forming a p⁻ type layer (so-called, resurf layer) as the JTE in a manner of continuously, outwardly extending from part of the Schottky electrode to deplete the p⁻ type layer during a reverse bias and reduce the electric field at the end of the Schottky electrode. The withstanding voltage principally depends on a depthwise integral value of the concentration of the p⁻ type layer, that is, on the dose amount of ions used to form the p⁻ type layer. In order to obtain an ideal withstanding voltage, the dose amount is required to represent a value approximate to $\in Ec/q$ where Ec denotes a breakdown electric field intensity, $\in$ denotes a dielectric constant, and q denotes an electric charge elementary quantum.

In recent year, in order to dramatically improve performance of power devices using silicon, power devices using silicon carbide (SiC) have been developed. The silicon carbide is a sort of wide-bandgap semiconductor, and has a breakdown electric field intensity 10 times larger than that of silicon. Therefore, it is possible to overcome a trade-off problem between the withstanding voltage and the ON-resistance of the semiconductor power devices. As in the devices using silicon, even in high-withstanding voltage semiconductor devices using silicon carbide, the JTE is formed on the surface to obtain a high withstanding voltage.

However, since silicon carbide has anisotropy in the breakdown electric field intensity, the electric field at the end of the JTE is deviated at a tilt with respect the C-axis direction where the breakdown electric field intensity is largest. Therefore, the withstanding voltage is significantly deteriorated. Typically, the breakdown electric field intensities $Ec_1$ and $Ec_2$ in the C-axis (<0001> orientation) and the A-axis (<11-20> orientation) perpendicular to the C-axis, respectively, can be expressed as the following equations.

$$Ec_1 = 2.70 \times 10^6 (Nd/10^{16})^{0.1} \, [V/cm] \quad (1)$$

$$Ec_2 = 2.19 \times 10^6 (Nd/10^{16})^{0.1} \, [V/cm] \quad (2)$$

where, Nd denotes a doner concentration in an epitaxial film formed on the SiC substrate, and the symbol "-" denotes a bar attached over a number according to a crystallographical principle.

Due to anisotropy of the breakdown electric field intensity, the breakdown electric field intensity in the A-axis direction is lower than the breakdown electric field intensity in the C-axis direction by 10% or more. If this reduction is calculated in terms of the withstanding voltage, it corresponds to 30% or more.

As described above, in the silicon carbide semiconductors, it is desired to effectively prevent deterioration of the withstanding voltage caused by anisotropy of the breakdown electric field intensity without an increase in costs.

SUMMARY OF THE INVENTION

A semicondutor device made of silicon carbide described in this application contains:

an angle between a normal vector of a substrate surface and an orientation <0001> or <000-1> is 0° or more and 8° or less;

a first conductivity type semicondutor layer made of silicon carbide is formed on the semicondutor substrate;

an active area is formed on a surface of the semicondutor layer;

a first semiconductor area of a second conductivity type having an impurity concentration and depth, is formed on the surface of the semicondutor layer to surround the active area;

a second semiconductor area, provided to adjoin an outer side of the first semiconductor area on the surface of the semiconductor layer and surround the first semiconductor area, in which a second conductivity type impurity area having the same impurity concentration and the same depth as those of the first semiconductor area is formed in a mesh shape;

a third semicondutor area of the second conductivity type is formed around the first semiconductor area and the second semicondutor area and having a depth and impurity concentration;

a first electrode is provided on the active area; and a second electrode is provided on a rear surface of the semicondutor substrate, wherein, where $\in$ denotes a relative permittivity of silicon carbide, $Ec_1$ and $Ec_2$ denote breakdown electric field intensities of silicon carbide in the orientation <0001> and <11-20>, respectively, and q denotes an electric charge elementary quantum, a depthwise integral value of the impurity concentration of the first semicondutor area is set to be $0.8 \in Ec_1/q$ or more and $1.2 \in Ec_1/q$ or less, and the value obtained by averaging the depthwise integral value of the impurity concentration of the impurity area within the second semicondutor area is $0.4 \in Ec_2/q$ or more and $1.1 \in Ec_2/q$ or less, and a depthwise integral value of the impurity concentration of the third semiconductor area is $0.4 \in Ec_2/q$ or more and $1.1 \in Ec_2/q$ or less.

DETAILED DESCRIPTION OF THE PREFERRED EMBODIMENTS

Figure 1:
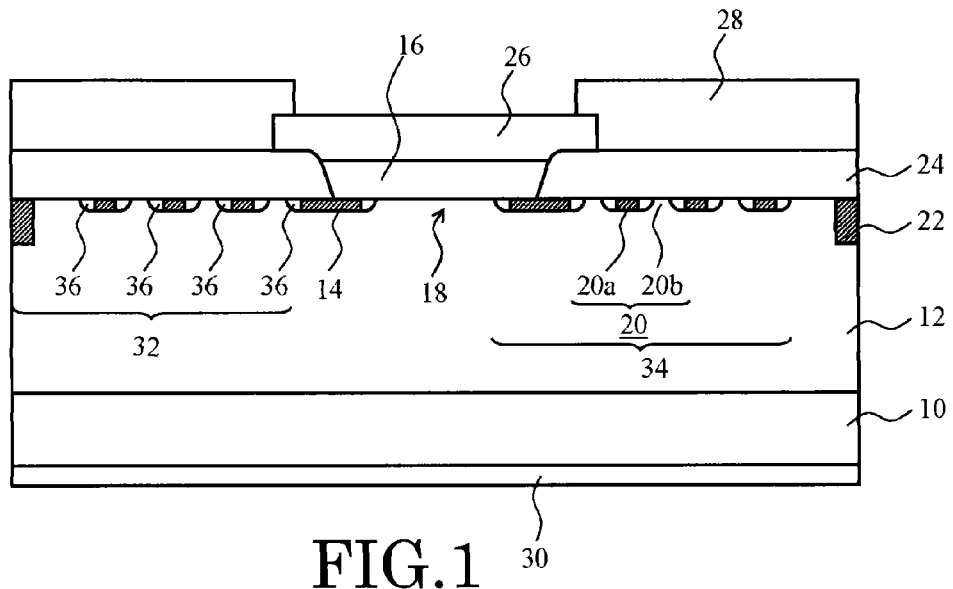
FIG. 1 is a schematic cross-sectional view illustrating a semiconductor device according to a first embodiment.

Embodiments have been made to address the aforementioned problems, and an object thereof is to provide a semiconductor device having a structure that can be manufactured at a low cost and capable of preventing deterioration of the withstanding voltage.

The semiconductor device according to an aspect is a semiconductor device obtained by using a silicon carbide semiconductor substrate. The semiconductor substrate is made of silicon carbide in which an angle between a normal vector of a substrate surface and an orientation <0001> or <000-1> is 0° or more and 8° or less. In addition, on the semiconductor substrate, there are provided a first conductivity type semiconductor layer made of silicon carbide; an active area formed on the surface of the semiconductor layer; a first semiconductor area of a second conductivity type, formed on the surface of the semiconductor layer to surround the active area; and a second semiconductor area, provided to adjoin an outer side of the first semiconductor area on the surface of the semiconductor layer and surround the first semiconductor area, in which a second conductivity type impurity area having the same impurity concentration and the same depth as those of the first semiconductor area is formed in a mesh shape. In the periphery of the first and second semiconductor areas, a third semiconductor area of a second conductivity type is formed. In addition, a first electrode is provided on the active area, and a second electrode is provided on a rear surface of the semiconductor substrate. In addition, assuming that $\in$ denotes a relative permittivity of silicon carbide, $Ec_1$ and $Ec_2$ denote breakdown electric field intensities of silicon carbide in the orientation <0001> (or <000-1>) and <11-20>, respectively, and q denotes an electric charge elementary quantum, a depthwise integral value of the impurity concentration of the first semiconductor area is $0.8 \in Ec_1/q$ or more and $1.2 \in Ec_1/q$ or less, and the value obtained by averaging the depthwise integral value of the impurity concentration of the impurity area within the second semiconductor area is $0.4 \in Ec_2/q$ or more and $1.1 \in Ec_2/q$ or less. In addition, the depthwise integral value of the impurity concentration of the third semiconductor area is $0.4 \in Ec_2/q$ or more and $1.1 \in Ec_2/q$ or less.

According to an aspect, there is provided a semiconductor device including: a semiconductor substrate made of silicon carbide in which an angle between a normal vector of a substrate surface and an orientation <0001> or <000-1> is 0° or more and 8° or less; a first conductivity type semiconductor layer made of silicon carbide formed on the semiconductor substrate; an active area formed on a surface of the semiconductor layer; a first semiconductor area of a second conductivity type, formed on a surface of the semiconductor layer to surround the active area; a second semiconductor area, provided to adjoin an outer side of the first semiconductor area on a surface of the semiconductor layer and surround the first semiconductor area, in which a second conductivity type impurity area having the same impurity concentration and the same depth as those of the first semiconductor area is formed in a mesh shape; a first electrode provided on the active area; a third semiconductor area of a second conductivity type formed around the first and second semiconductor areas; and a second electrode provided on a rear surface of the semiconductor substrate, wherein, assuming that c denotes a relative permittivity of silicon carbide, $Ec_1$ and $Ec_2$ denote breakdown electric field intensities of silicon carbide in the orientation <0001> (or <000-1>) and <11-20>, respectively, and q denotes an electric charge elementary quantum, a depthwise integral value of the impurity concentration of the first semiconductor area is $0.8 \in Ec_1/q$ or more and $1.2 \in Ec_1/q$ or less, and the value obtained by averaging the depthwise integral value of the impurity concentration of the impurity area within the second semiconductor area is $0.4 \in Ec_2/q$ or more and $1.1 \in Ec_2/q$ or less, and wherein the depthwise integral value of the impurity concentration of the third semiconductor area is $0.4 \in Ec_2/q$ or more and $1.1 \in Ec_2/q$ or less.

In the aforementioned semiconductor device, it is preferable that the width of the third semiconductor area be larger than the depth of the PN junction of the third semiconductor area.

In the aforementioned semiconductor device, it is preferable that, assuming that the semiconductor layer has an n type, and a doner concentration of the semiconductor layer is denoted by Nd, a sum of widths of the first and second semiconductor areas be $eEc_1/qNd$ or more.

In the aforementioned semiconductor device, it is preferable that the width of the second semiconductor area be $\in Ec_2/qNd$ or more.

In the aforementioned semiconductor device, it is preferable that the interval of the impurity area be equal to or smaller than $2 \times \in Ec_2/qNd$.

In the aforementioned semiconductor device, it is preferable that a ratio of the impurity area occupied in the second semiconductor area be gradually reduced from the inner side to the outer side of the second semiconductor area.

In the aforementioned semiconductor device, it is preferable that the first semiconductor area make contact with the first electrode.

In the aforementioned semiconductor device, it is preferable that the semiconductor substrate have a first conductivity type, and the first electrode make Schottky contact with the semiconductor layer so as to form a Schottky barrier diode in the active area.

In the aforementioned semiconductor device, it is preferable that a third semiconductor area of a second conductivity type be further provided on the surface of the active area, the semiconductor substrate have a first conductivity type, and a PN diode structure be formed in the active area.

In the aforementioned semiconductor device, it is preferable that the semiconductor substrate be a first conductivity type, and a MISFET structure be formed in the active area.

In the aforementioned semiconductor device, it is preferable that the semiconductor substrate have a second conductivity type, and an IGBT structure be formed in the active area.

According to the semiconductor device of the present embodiment, it is possible to provide a semiconductor device having a structure that can be manufactured with low cost and prevent deterioration of the withstanding voltage.

Hereinafter, embodiments will be described in more detail with reference to the accompanying drawings.

Herein, the "active area" of the semiconductor device refers to an area having a structure used to implement a main function of the semiconductor device. For example, if the semiconductor device is a Schottky barrier diode, the area having a Schottky junction corresponds to the active area. If the semiconductor device is a metal insulator semiconductor field effect transistor (MISFET), an area having a channel corresponds to the active area.

[First Embodiment]

The semiconductor device according to the present embodiment includes: a semiconductor substrate made of silicon carbide in which an angle between a normal vector of a substrate surface and an orientation <0001> or <000-1> is 0° or more and 8° or less; a first conductivity type semiconductor layer made of silicon carbide formed on the semiconductor substrate; an active are formed on a surface of the semiconductor layer; a first semiconductor area of a second conductivity type, formed on a surface of the semiconductor layer to surround the active area; a second semiconductor area, provided to adjoin an outer side of the first semiconductor area on a surface of the semiconductor layer and surround the first semiconductor area, in which a second conductivity type impurity area having the same impurity concentration and the same depth as those of the first semiconductor area is formed in a mesh shape; a first electrode provided on the active area; and a second electrode provided on a rear surface of the semiconductor substrate. Assuming that $\in$ denotes a relative permittivity of silicon carbide, $Ec_1$ and $Ec_2$ denote breakdown electric field intensities of silicon carbide in the orientation <0001> (or <000-1>) and <11-20>, respectively, and q denotes a electric charge elementary quantum, a depthwise integral value of the impurity concentration of the first semiconductor area is set to be $0.8 \in Ec_1/q$ or more and $1.2 \in Ec_1/q$ or less, and the value obtained by averaging the depthwise integral value of the impurity concentration of the impurity area within the second semiconductor area is $0.4 \in Ec_2/q$ or more and $1.1 \in Ec_2/q$ or less.

Specifically, "the value obtained by averaging the depthwise integral value of the impurity concentration of the impurity area within the second semiconductor area" is a value obtained by multiplying the depthwise integral value of the impurity concentration of the second conductivity type impurity area of the second semiconductor area by (the area of the second conductivity type impurity area of the second semiconductor area)/(the area of the second semiconductor area). That is, the value is a depthwise integral value of the impurity concentration by assuming that impurities in the impurity area are uniformly distributed within the second semiconductor area. The third semiconductor area is formed around the first semiconductor area and the second semiconductor area, and the depthwise integral value of the impurity concentration thereof is $0.4 \in Ec_2/q$ or more and $1.1 \in Ec_2/q$ or less.

The semiconductor device according to the present embodiment is provided with the first semiconductor area, as a JTE, and the second semiconductor area which is located in the outer side than the first semiconductor area and has a concentration lower than that of the first semiconductor area in average so that deterioration of the withstanding voltage is prevented in the terminated portion of the device. Furthermore, the second semiconductor area is formed in the impurity area that has the same impurity concentration and the same depth as those of the first semiconductor area. Moreover, the third semiconductor area is formed around the first and second semiconductor areas, and its depthwise integral value of the impurity concentration is equal to larger than $0.4 \in Ec_2/q$ and equal to or smaller than $1.1 \in Ec_2/q$. The third semiconductor area is formed through a self-alignment process. In this configuration, the first, second, and third semiconductor areas can be formed using the same mask process. Therefore, it can be manufactured with low cost.

Figure 2:
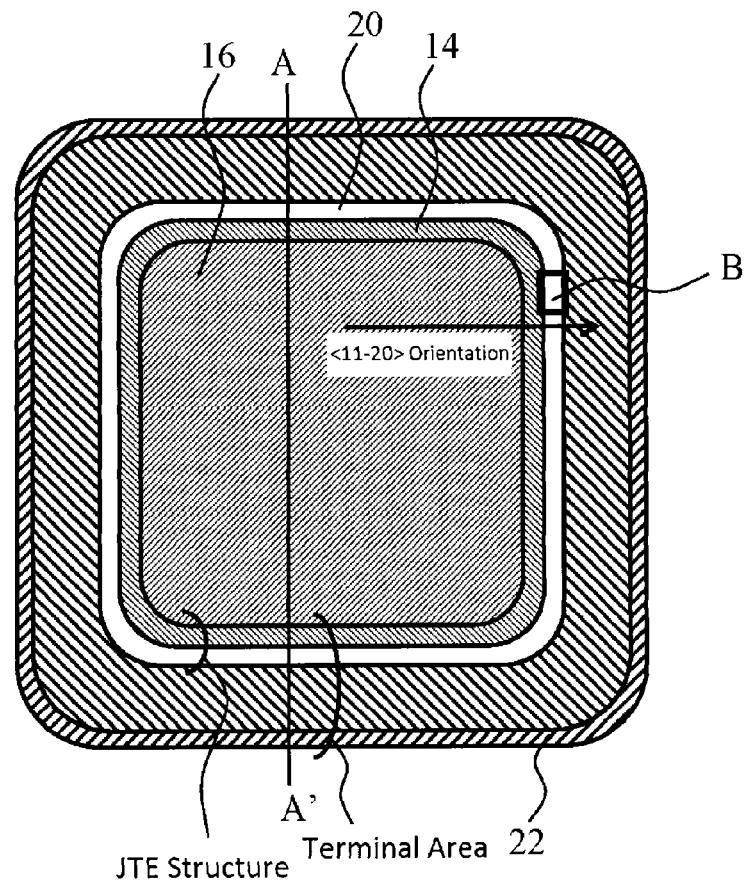
FIG. 2 is a schematic top view illustrating the semiconductor device according to a first embodiment.
Figure 3:
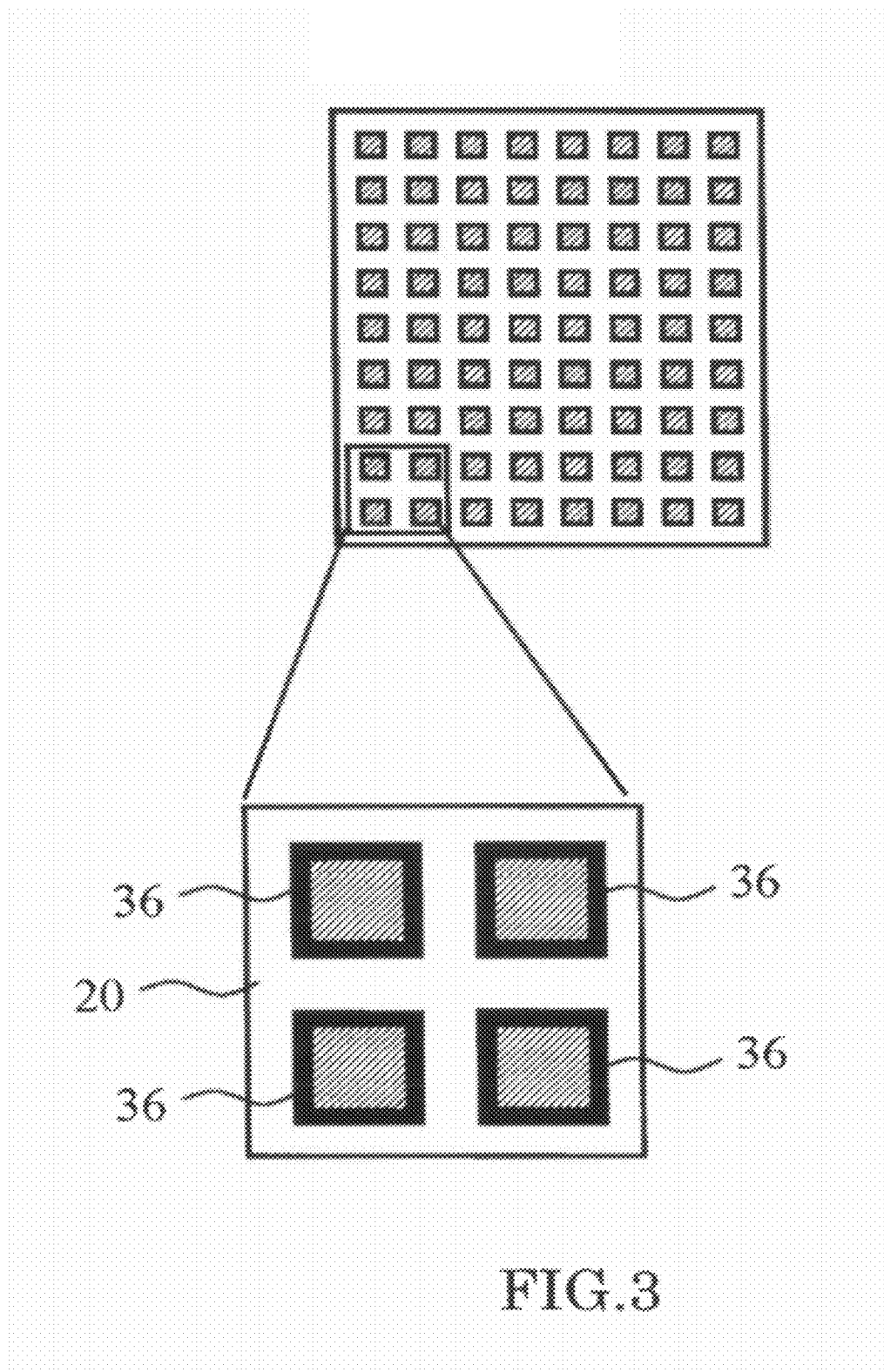
FIG. 3 is a partially enlarged view of FIG. 2.

FIG. 1 is a schematic cross-sectional view illustrating a semiconductor device according to the present embodiment. FIG. 2 is a schematic top view illustrating a semiconductor device according to the present embodiment. FIG. 1 is a cross-sectional view taken along the line AA' of FIG. 2. FIG. 3 is an enlarged view illustrating the rectangular portion B of FIG. 2. Here, as a sort of the semiconductor device, a Schottky barrier diode will be exemplarily described. In FIG. 3, the portion surrounded by the third semiconductor area 36 is a portion where any ion is not implanted.

As shown in FIG. 1, the Schottky barrier diode according to the present embodiment is formed in an n⁻ type SiC semiconductor layer 12 epitaxially grown on the n⁺ type SiC semiconductor substrate 10. In the n⁺ type SiC semiconductor substrate 10, an angle between the normal vector of the substrate surface and the orientation <0001> or <000-1> is 0° or more and 8° or less. In addition, as the JTE, a p⁻ type first semiconductor area 14 is formed on the surface of the n⁻ type semiconductor layer 12.

The inner side of the first semiconductor area 14 serves as an active area 18 where the Schottky electrode 16 and the n⁻ type SiC semiconductor layer 12 make Schottky contact. The first semiconductor area 14 is partially overlappingly connected to the Schottky electrode 16 and formed to surround the active area 18. FIGS. 2 and 3 are top views before the Schottky electrode 16 is formed.

Furthermore, the second semiconductor area 20 is provided to adjoin the outer side of the first semiconductor area 14 and surround the first semiconductor area 14. As shown in FIG. 3, in the second semiconductor area 20, a p⁻ type impurity area 20a is formed in a mesh shape and has the same impurity concentration and the same depth as those of the first semiconductor area 14. That is, the second semiconductor area 20 includes a p⁻ type impurity area 20a having a mesh shape and an n⁻ type impurity area 20b having an island shape corresponding to the surface of the n⁻ type SiC semiconductor layer 12.

Furthermore, an n⁺ type channel stopper area 22 is formed in the end of the surface of the n⁻ type SiC semiconductor layer 12. The outer end of the second semiconductor area 20 is separated from the inner end of the n⁺ type channel stopper area 22.

The surface of the n⁻ type SiC semiconductor layer 12 is covered by, for example, a silicon oxide film 24 so as to open the upper portion of the Schottky electrode 16 formed of, for example, Ti. Then, the first electrode (anode) 26 made of, for example, Al is formed.

In addition, the entire surface is covered by the protection layer 28 such as polyimide, and the upper portion of the first electrode 26 is opened. A second electrode (cathode) 30 made of, for example, Ni is formed on the rear surface of the type SiC semiconductor substrate 10.

Here, the outer area from the first semiconductor area 14 is called a termination area 32, and the area composed of the first semiconductor area 14 and the second semiconductor area 20 is called a junction termination extension (JTE) 34.

Figure 4:
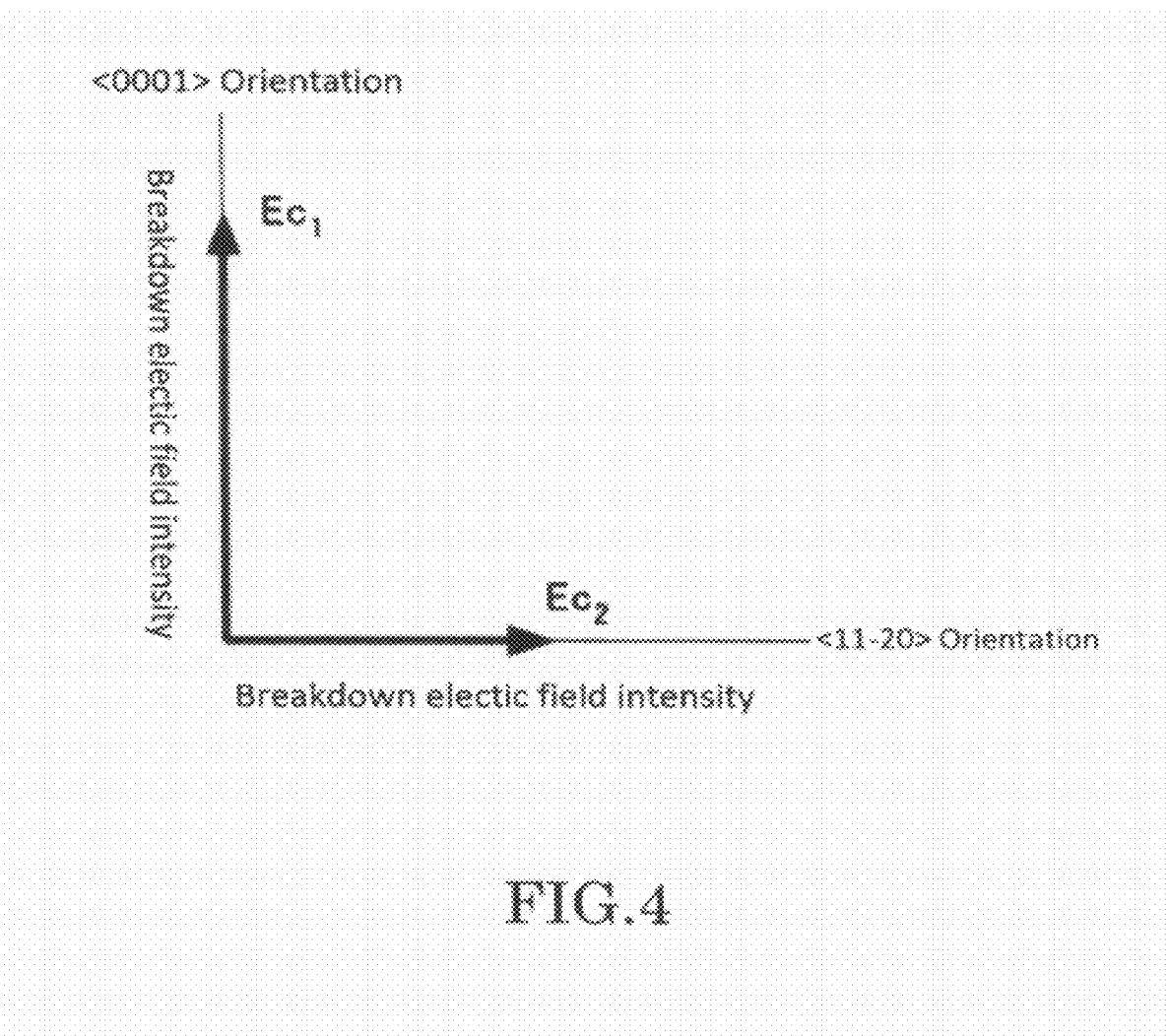
FIG. 4 is an explanatory diagram illustrating anisotropy of the SiC semiconductor substrate.

The SiC semiconductor substrate used in the present embodiment has anisotropy in the withstanding voltage as described above. FIG. 4 is an explanatory diagram illustrating the SiC semiconductor substrate. As shown in FIG. 4, the breakdown electric field intensity $Ec_1$ in the orientation <0001> and the breakdown electric field intensity $Ec_2$ in the orientation <11-20> have a relation $Ec_1 > Ec_2$. In addition, each of the values can be computed using the aforementioned equations (1) and (2).

The breakdown electric field intensity based on the aforementioned equations (1) and (2) is obtained by assuming that the angle between the normal vector of the substrate surface and the orientation <0001> or <000-1> is 0°, that is, an OFF-angle of the substrate surface is 0°. If the OFF-angle is set to 8°, the breakdown electric field intensity $Ec_1'$ in the direction perpendicular to the substrate surface and the breakdown electric field intensity $Ec_2'$ in the direction parallel to the substrate surface are given by the following equations.

$$Ec_1' = 2.68 \times 10^{15} (Nd/10^{16})^{0.1} [V/cm] \quad (3)$$

$$Ec_2' = 2.14 \times 10^{15} (Nd/10^{16})^{0.1} [V/cm] \quad (4)$$

That is, a difference between the equations (1) and (3) and a difference between the equations (2) and (4) do not reach 1%. Therefore, a case where the OFF-angle is set to 8° can be considered identical to a case where the OFF-angle is set to 0°.

Figure 5:
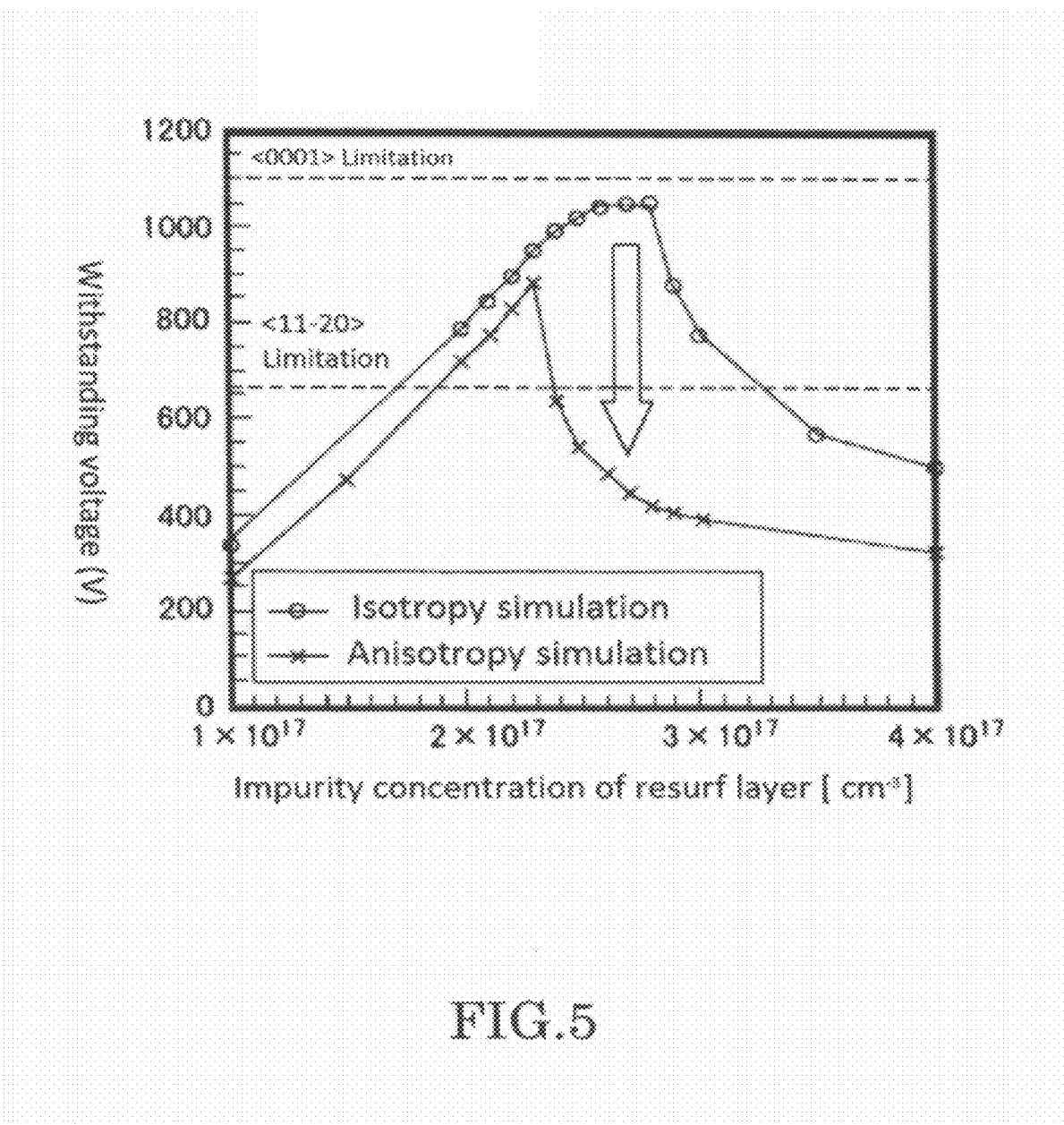
FIG. 5 is a diagram illustrating a relation between the impurity concentration and the withstanding voltage of the Schottky barrier diode of the related art.

FIG. 5 is a simulation result illustrating deterioration of the withstanding voltage against anisotropy of the breakdown electric field intensity in a Schottky barrier diode of the related art (having a single typical resurf layer). As a semiconductor layer, 4H-SiC (silicon carbide) is used.

The abscissa denotes an impurity concentration of the resurf layer corresponding to the JTE, and the ordinate denotes an insulation breakdown voltage (breakdown withstanding voltage) of the Schottky barrier diode. Typically, the insulation breakdown voltage can be expressed as a function of the depthwise integral value of the impurity concentration in the semiconductor area (hereinafter, referred to as a dose amount). In this computation, it is assumed that the concentration is uniform, and the depth is set to 0.6 μm. A simulation result obtained by assuming that the breakdown electric field intensity is isotropic, and an absolute value thereof is set to a value in the orientation <0001> is indicated by data marked as O. Referring to this result, if the concentration of the first semiconductor area is optimized, the withstanding voltage in the orientation <0001> becomes nearly equal to the ideal withstanding voltage (shown as a <0001> limitation).

Meanwhile, data marked as x denotes a result of computing the insulation breakdown voltage by introducing anisotropy into the breakdown electric field intensity depending on reality, and setting the breakdown electric field intensities in the orientations <0001> and <11-20> as experimental values. Referring to the computation result, the insulation breakdown voltage is reduced by about 10% in comparison with the ideal withstanding voltage in the orientation <0001>, and the optimal impurity concentration of the resurf layer is different from the case where anisotropy is not considered. If the impurity concentration of the resurf layer is set to an optimal value based on a design technique of the related art (isotropic simulation), it is recognized that the withstanding voltage is reduced by 50% or more.

Figure 6:
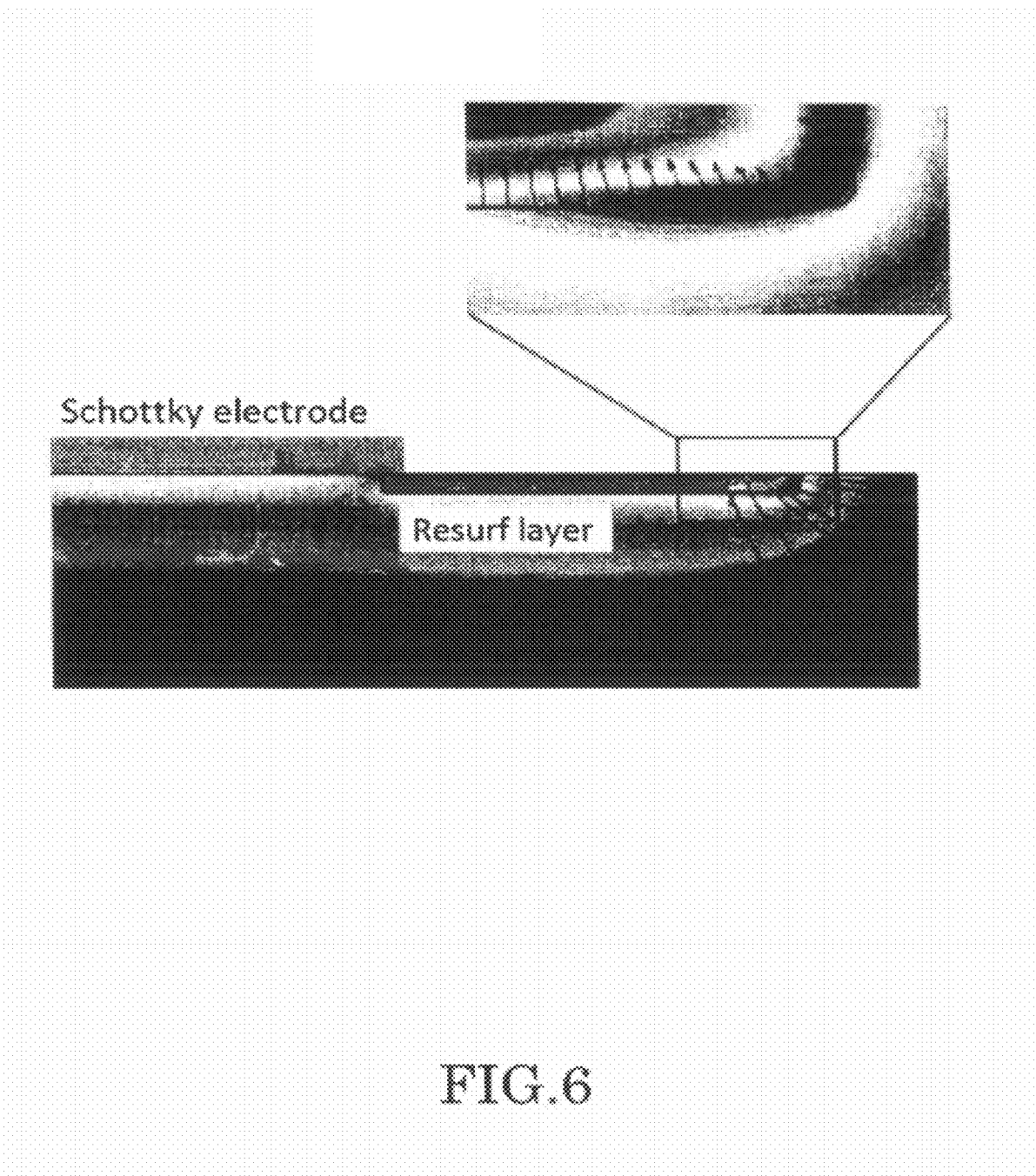
FIG. 6 is a simulation result of the electric field intensity and the electric field distribution of the Schottky barrier diode of the related art.

FIG. 6 is a simulation result of the electric field distribution, and the direction and the magnitude of the electric field intensity in the Schottky barrier diode having only a single resurf layer in the related art. If a design concentration of the $p^-$ type layer as the resurf layer is set to an optimal design value of the related art, the electric field direction at the edge of the termination structure is deviated in the direction perpendicular to the C-axis. Therefore, the withstanding voltage is deteriorated.

In FIG. 6, the magnitude and the direction of the electric field are indicated by arrows. It is recognized that the arrows in the end of the resurf layer are highly stretched in the direction parallel to the substrate surface. Since the breakdown strength in this direction is smaller than that in the direction perpendicular to the substrate surface as described in conjunction with FIG. 4, the withstanding voltage is deteriorated. In addition, distribution of the electric field intensity is illustrated as a gray scale.

Figure 7:
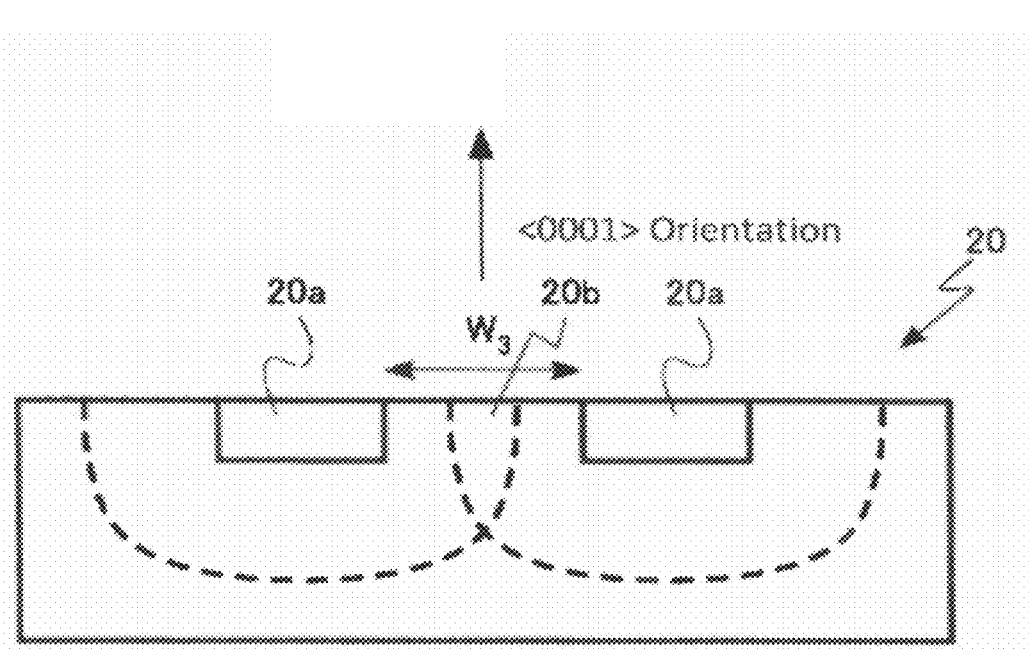
FIG. 7 is an explanatory diagram illustrating the effect of the second semiconductor area according to the first embodiment.

FIG. 7 is an explanatory diagram illustrating the effect when only the second semiconductor area exists. The dotted line denotes the depletion layer diffused by applying a reverse bias from the substrate side while the electric potential of the $p^-$ type impurity area 20a of the second semiconductor area 20 is fixed to zero. Since the electric potential of the $p^-$ type impurity area 20a is fixed, the depletion layer is diffused toward the horizontal direction as well as the substrate direction.

Therefore, the entire $p^-$ type impurity area 20a is depleted more quickly by applying a voltage when the size of the $p^-$ type impurity area 20a is equal to or smaller than the diffusion of the depletion layer in the vertical direction in comparison with the case where the $p^-$ type layer is diffused infinitely. In the second semiconductor area, the $p^-$ type impurity area 20a having the same depth and the same impurity concentration as those of the first semiconductor area has a mesh shape. Such a structure is equivalent to the case where the semiconductor area having a concentration lower than that of the first semiconductor area is provided in the outer side of the first semiconductor area.

As shown in FIG. 7, from the viewpoint of alleviation of the electric field parallel to the substrate surface, it is preferable that the separation interval $W_3$ of the $p^-$ type impurity areas 20a be equal to or smaller than a distance at which the depletion layers make contact with each other before the insulation breakdown voltage is reached.

Figure 8:
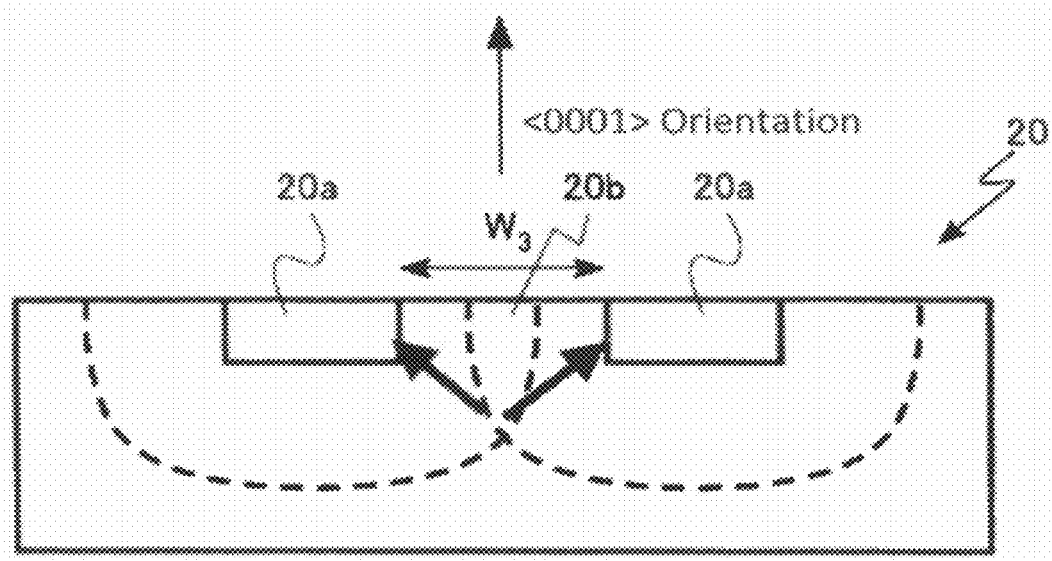
FIG. 8 is a diagram illustrating a relation between the horizontal direction electric field and the effect of the second semiconductor area according to the first embodiment.

However, as shown in FIG. 8, even when the $p^-$ type impurity area is arranged at a distance where the depletion layers make contact with each other by applying a reverse bias, an electric field is unavoidably applied not immediately beneath the p type impurity area but from the depletion layer in the horizontal direction. Therefore, it is necessary to design the electric field intensity in the horizontal direction not to reach a maximum electric field intensity.

Figure 9:
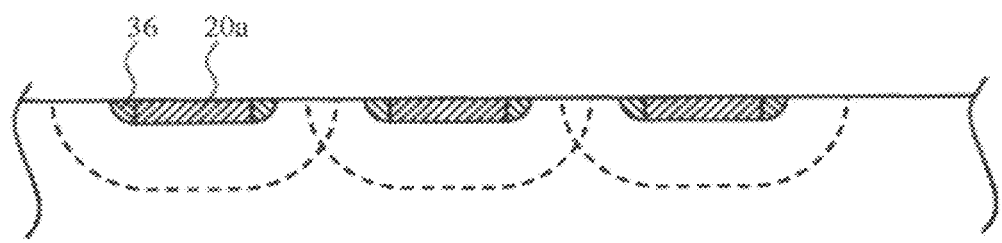
FIG. 9 is an explanatory diagram illustrating the effect when a second semiconductor area and a third semiconductor area exist according to the first embodiment.

FIG. 9 is an explanatory diagram illustrating the effect when the second and third semiconductor areas according to the present embodiment exist. The dotted line denotes the depletion layer diffused by applying a reverse bias from the substrate side while the electric potential of the $p^-$ type impurity area 20a of the second semiconductor area 20 is fixed to zero. Since the electric potential of the $p^-$ type impurity area 20a is fixed, the depletion layer is diffused in the horizontal direction as well as the substrate direction. Since the dose amount of the $P^-$ well extending area (third semiconductor area) is smaller than the dose amount corresponding to the maximum electric field intensity in the horizontal direction, the P⁻ well extending area is depleted before the maximum electric field in the horizontal direction is reached.

Since the electric field in the horizontal direction is alleviated based on this effect, the second semiconductor area located in the outer side of the JTE is depleted by the voltage before the designed withstanding voltage is reached. As a result, the electric field component is alleviated which is parallel to the substrate surface applied to the outer circumference of the first semiconductor area.

Figure 10:
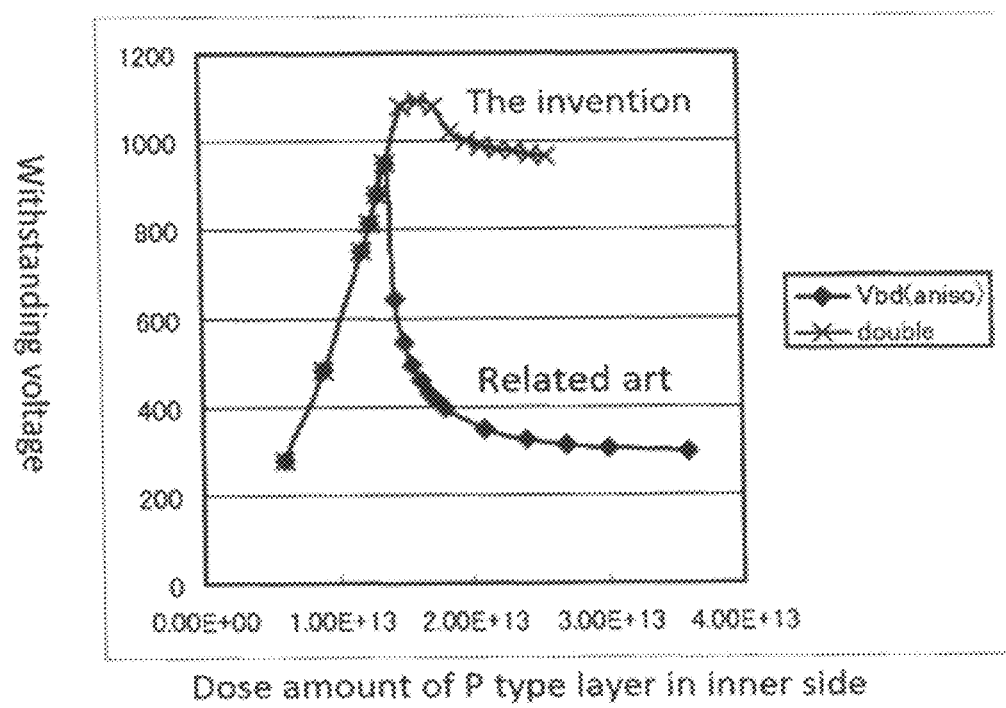
FIG. 10 is a diagram illustrating a relation between the withstanding voltage and the dose amount of the second semiconductor area according to the first embodiment.

FIG. 10 is a diagram illustrating a relation between the dose amount and the withstanding voltage of the first semiconductor area in the semiconductor device according to the present embodiment. That is, FIG. 10 illustrates a comparison result of simulation for the withstanding voltages between the Schottky barrier diode of the related art (data marked as •) only having the first semiconductor area and the Schottky barrier diode of the present embodiment (data marked as ×). In the example of the related art, the abscissa denotes a dose amount of the resurf layer corresponding to the first semiconductor area. According to the present embodiment, the abscissa denotes a dose amount of the first semiconductor area corresponding to the inner side of the JTE.

According to the present embodiment, it is possible to improve the withstanding voltage up to a limitation value in the orientation <0001>. In addition, the maximum effect can be obtained when the integral value of the impurity concentration in the depthwise direction is $Ec_1/q$, and a recognizable effect is obtained at a range of $0.8 \in Ec_1/q$ or more and $1.2 \in Ec_1/q$ or less.

When the dose amount is larger than the aforementioned range, the electric field is concentrated on the end of the resurf layer, and the withstanding voltage is deteriorated. Meanwhile, when the dose amount is smaller than the aforementioned range, the resurf layer is completely depleted, so that the electric field blocking effect of the resurf layer is insufficient, the electric field is concentrated on the end of the Schottky electrode, and the withstanding voltage is deteriorated.

Figure 11:
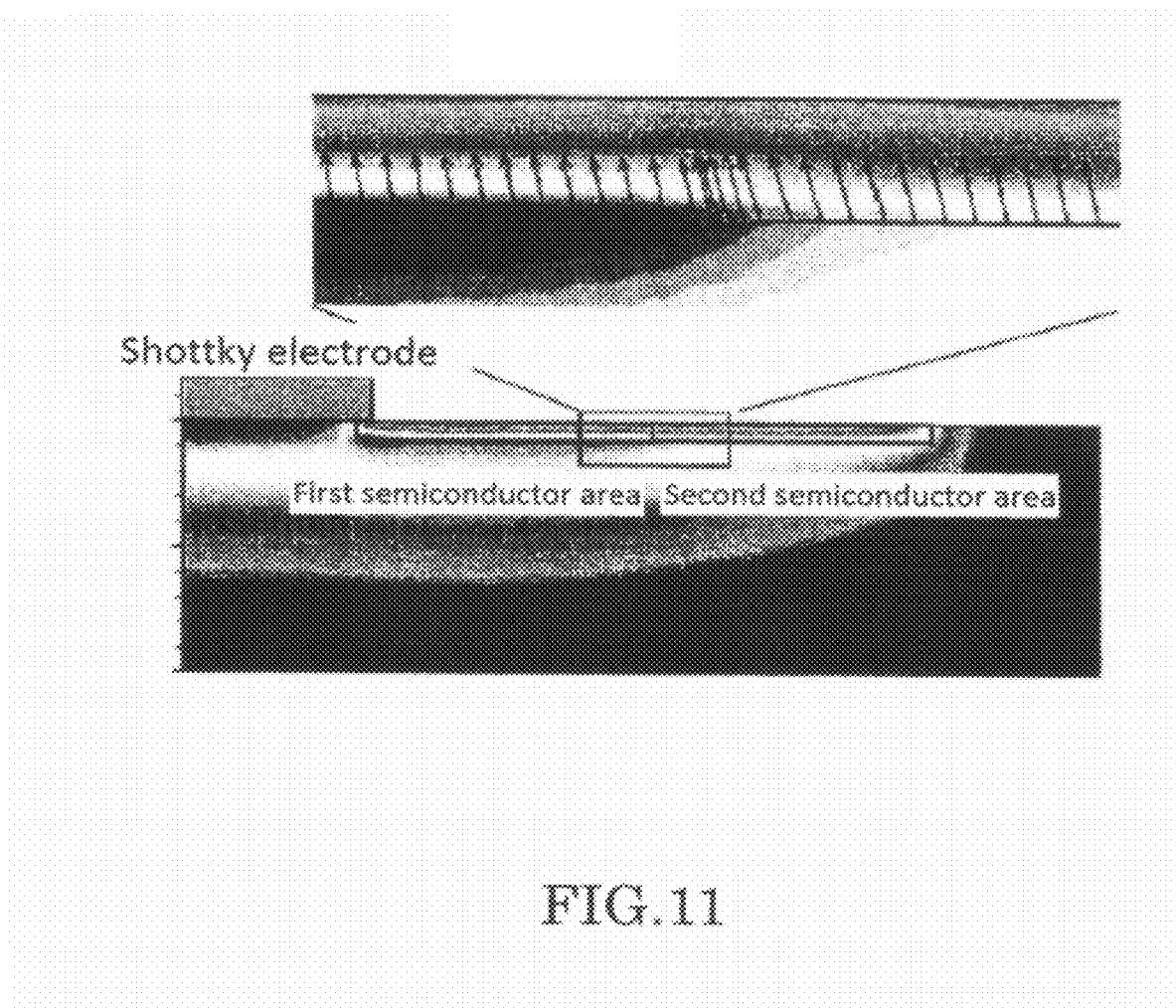
FIG. 11 is a diagram illustrating the effect of the first embodiment.

FIG. 11 is a diagram illustrating the effect of the first embodiment. That is, FIG. 11 illustrates a result of simulation for an electric field distribution, and the direction and the magnitude of the electric field intensity in the JTE according to the present embodiment. The magnitude and the direction of the electric field are denoted by arrows in the drawing. Distribution of the electric field intensity is illustrated as a gray scale.

As shown in the drawing, according to the present embodiment, the maximum electric field direction is <0001> at a maximum electric field portion in the device, that is, an interface between the first semiconductor area and the second semiconductor area. That is, in this structure, the electric field from the horizontal side having a weak breakdown strength is suppressed by the second semiconductor area, and the electric field in the vertical direction having a strong breakdown strength is received.

As such, according to the present embodiment, the second semiconductor area, which is the JTE in the outer side, contributes to reduction of the electric field in the <11-20> direction, and the first semiconductor area, which is the JTE in the inner side, contributes to reduction of the electric field in the <0001> direction.

Figure 12:
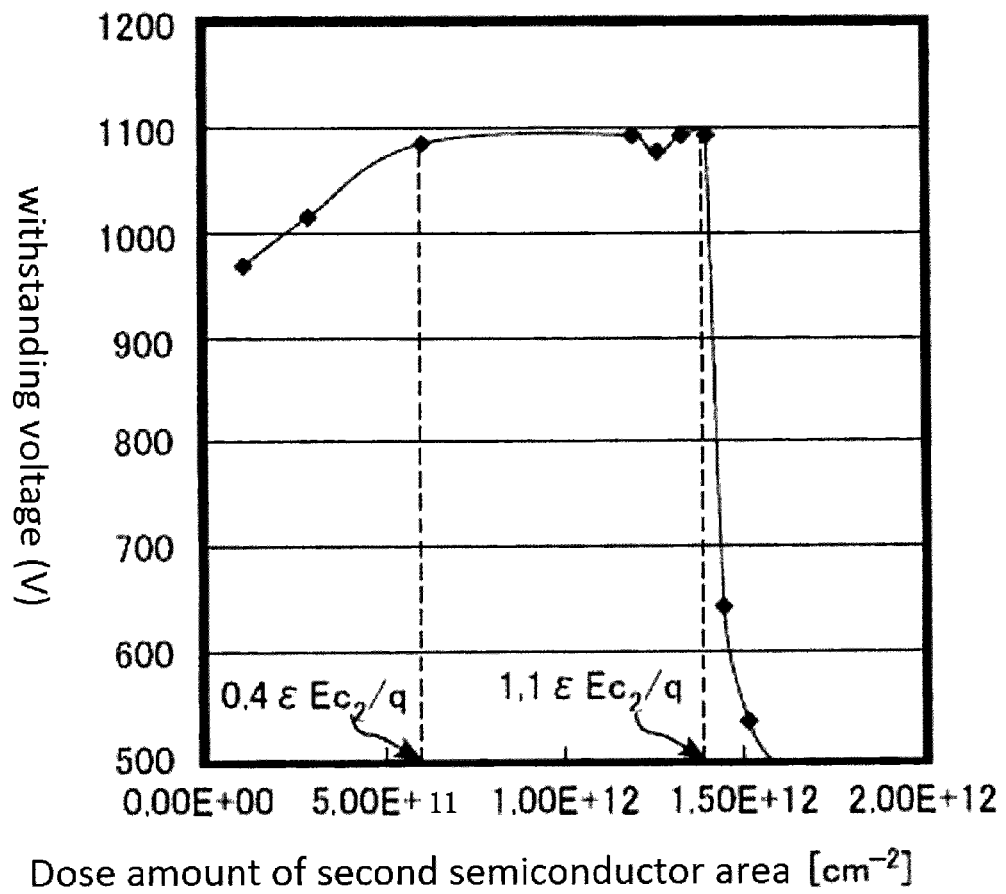
FIG. 12 illustrates a simulation result for determining an optimal dose amount range of the second semiconductor area.

FIG. 12 illustrates a result of simulation for an optimal dose amount range of the second semiconductor area.

Here, the dose amount of the second semiconductor area is a value obtained by averaging the depthwise integral values of the impurity concentration in the p⁻ type impurity area 20a of FIG. 3 within the second semiconductor area. In other words, it means a dose amount obtained by assuming that the p⁻ type impurities inside the second semiconductor area are uniformly distributed inside the second semiconductor area.

If the dose amount of the second semiconductor area exceeds $1.1 \in Ec_2/q$, the electric field is concentrated on the end of the second semiconductor area, and the withstanding voltage is steeply reduced. Meanwhile, for the lower limitation of the dose amount, the effect of preventing deterioration of the withstanding voltage is recognizable if the dose amount is $0.4 \in Ec_2/q$ or more.

Figure 13:
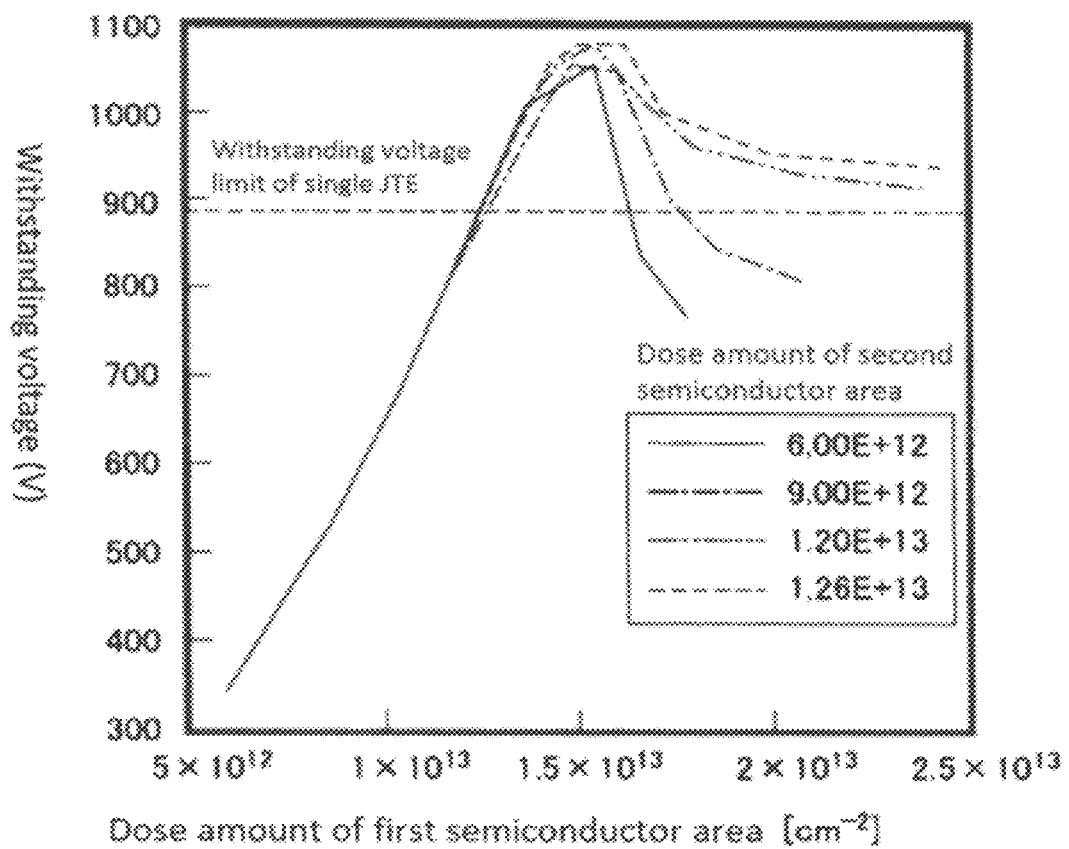
FIG. 13 is a diagram illustrating dependence of the dose amount of the second semiconductor area on the optimal dose amount of the first semiconductor area.

FIG. 13 is a diagram illustrating dependence of the optimal dose amount of the first semiconductor area on the dose amount of the second semiconductor area. It is recognized that, as the dose amount of the second semiconductor area is reduced from the optimal dose amount, a margin of the dose amount of the first semiconductor area is reduced. First of all, since the peak value of the withstanding voltage is higher than a withstanding voltage limitation of a single JTE, it is recognized that the effect of the horizontal electric field alleviation is continued. The withstanding voltage limitation of a single JTE is a limitation value at which the withstanding voltage cannot be increased any more in the example of the related art in which the JTE includes only a resurf layer.

The horizontal length of the JTE is preferably set to be equal to or larger than the horizontal length of the depletion layer of the electrode circumference portion so as to terminate the electric force line from the depletion layer of this area. The width of the depletion layer is expressed as $\in Ec_1/qNd$, similar to the length of the depletion layer in the vertical direction.

According to the present embodiment, since the JTE includes a first semiconductor area located inside and a second semiconductor area located outside, it is preferable that the width of two area be $eEc_1/qNd$ or more. Therefore, it is preferable that the sum of the width $W_1$ of the first semiconductor area and the width $W_2$ of the second semiconductor area be $\in Ec_1/qNd$ or more. More preferably, the width $W_1$ of the first semiconductor area is $\in Ec_1/qNd$ or more.

Here, the depletion layer width endurable in the second semiconductor area can be expressed as (dose amount of second semiconductor area/Nd). Then, it is preferable that the width $W_1$ of the first semiconductor area be $\{\in Ec_1/qNd-(\text{dose amount of second semiconductor area}/Nd)\}$ or more.

In addition, it is preferable that the second semiconductor area endure the breakdown electric field intensity $Ec_2$ in the orientation <11-20>. Therefore, it is preferable that the width $W_2$ of the second semiconductor area be $\in Ec_2/qNd$ or more.

In addition, as described above, it is preferable that the interval $W_3$ of p⁻ type impurity areas 20a be equal to or smaller than a distance at which the depletion layers make contact with each other before the insulation breakdown voltage is reached. The length of the depletion layer that can endure the breakdown electric field intensity $Ec_2$ of the second semiconductor area is set to $\in Ec_2/qNd$. Therefore, it is preferable that the interval $W_3$ of the impurity area be equal to or smaller than $2 \times \in Ec_2/qNd$.

In the equations above, e denotes a relative permittivity of silicon carbide. $Ec_1$ and $Ec_2$ denote the breakdown electric field intensities of silicon carbide in the orientations <0001> and <11-20>, respectively. q denotes the electric charge elementary quantum. Nd denotes a doner concentration within the semiconductor layer.

As described above, according to the present embodiment, the p⁻ type impurity area has a mesh shape in the outer side of the first semiconductor area, which is a low-concentration p⁻ type area. Therefore, the second semiconductor area which is a p⁻ type area having a substantially further lower concentration is provided. With this configuration, it is possible to maximize the withstanding voltage in the silicon carbide semiconductor having anisotropy in the breakdown electric field intensity. Therefore, it is possible to obtain an intrinsic performance of the semiconductor.

In addition, according to the present embodiment, in the second semiconductor area, the second conductivity type impurity area having the same impurity concentration and the same depth as those of the first semiconductor area is formed in a mesh shape. For this reason, when the JTE is formed, the first and second semiconductor areas can be formed of the same time through the same photolithographic process and the same ion implantation process. Therefore, it is possible to reduce manufacturing cost.

Figure 14:
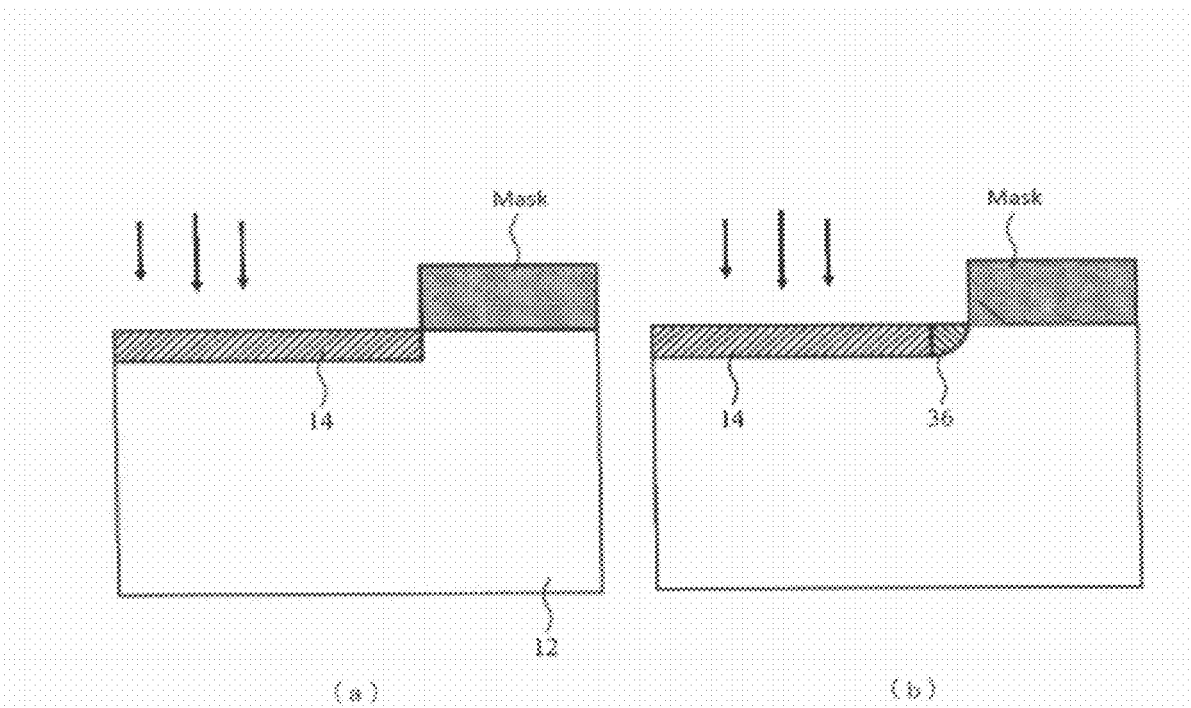
FIGS. 14A and 14B are cross-sectional views illustrating a self-alignment process used to form the third semiconductor area.

In addition, according to the present embodiment, as shown in FIGS. 14A and 14B, the third semiconductor area 36 is formed in the first and second semiconductor areas by performing a self-alignment process for the same mask as those of the first and second semiconductor areas. Therefore, since there is no additional mask process, it is possible to reduce manufacturing cost.

Hereinbefore, embodiments of the present invention have been described with reference to detailed examples. However, the foregoing embodiments are just exemplary and are not intended to limit the invention. Although description of the embodiments has been made by omitting portions of the semiconductor device and the like, not directly necessary in the present invention, necessary elements associated with the semiconductor device and the like may be suitably selected and used.

Although description has been made by exemplifying a case where the first conductivity type is set to an n type, and the second conductivity type is set to a p type, the same effects can be achieved even by reversing the conductivity type.

In addition, it is appreciated that the scope of the invention encompasses overall semiconductor devices that include elements of the present invention and can be suitably modified in design by those skilled in the art. The scope of the invention is to be defined by the appended claims and equivalents thereof.

While certain embodiments have been described, these embodiments have been presented by way of example only, and are note intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions

What is claimed is:

1. A semiconductor device comprising:
a semiconductor substrate made of silicon carbide in which an angle between a normal vector of a substrate surface and an orientation <0001> or <000-1> is 0° or more and 8° or less;
a first conductivity type semiconductor layer made of silicon carbide formed on the semiconductor substrate;
an active area formed on a surface of the semiconductor layer;
a first semiconductor area of a second conductivity type having an impurity concentration and depth, formed on the surface of the semiconductor layer to surround the active area;
a second semiconductor area, provided to adjoin an outer side of the first semiconductor area on the surface of the semiconductor layer and surround the first semiconductor area, in which a second conductivity type impurity area having the same impurity concentration and the same depth as those of the first semiconductor area is formed in a mesh shape;
a third semiconductor area of the second conductivity type formed around the first semiconductor area and the second semiconductor area and having a depth and impurity concentration;
a first electrode provided on the active area; and
a second electrode provided on a rear surface of the semiconductor substrate,
wherein, where γ denotes a relative permittivity of silicon carbide, $Ec_1$ and $Ec_2$ denote breakdown electric field intensities of silicon carbide in the orientation <0001> and <11-20>, respectively, and q denotes an electric charge elementary quantum, a depthwise integral value of the impurity concentration of the first semiconductor area is set to be $0.8\,\gamma Ec_1/q$ or more and $1.2\,\gamma Ec_1/q$ or less, and the value obtained by averaging the depthwise integral value of the impurity concentration of the impurity area within the second semiconductor area is $0.4\,\gamma Ec_2/q$ or more and $1.1\,\gamma Ec_2/q$ or less, and
a depthwise integral value of the impurity concentration of the third semiconductor area is $0.4\,\gamma Ec_2/q$ or more and $1.1\,\gamma Ec_2/q$ or less.

2. The semiconductor device according to claim 1, wherein, the semiconductor layer is n type, a donor concentration of the semiconductor layer is denoted by Nd, and a sum of widths of the first and second semiconductor areas is $\gamma Ec_1/qNd$ or more.

3. The semiconductor device according to claim 1, wherein a width of the second semiconductor area is $\gamma Ec_2/qNd$ or more.

4. The semiconductor device according to claim 1, comprising a plurality of second conductivity type impurity areas, wherein an interval between the second conductivity type impurity areas is equal to or smaller than $2\,x\gamma Ec_2/qNd$.

5. The semiconductor device according to claim 1, wherein a ratio of the impurity area occupied in the second semiconductor area is gradually reduced from an inner side to an outer side of the second semiconductor area.

6. The semiconductor device according to claim 1, wherein the first semiconductor area is in contact with the first electrode.

7. The semiconductor device according to claim 1, wherein the semiconductor substrate is a first conductivity type, and the first electrode makes Schottky contact with the semiconductor layer to form a Schottky barrier diode structure in the active area.

8. The semiconductor device according to claim 1, wherein the third semiconductor area of the second conductivity type is further provided on a surface of the active area, and wherein the semiconductor substrate is the first conductivity type, and a PN diode structure is formed in the active area.

9. The semiconductor device according to claim 1, wherein the semiconductor substrate is the first conductivity type, and a metal insulator semiconductor field effect transistor (MISFET) structure is formed in the active area.

10. The semiconductor device according to claim 1, wherein the semiconductor substrate is the second conductivity type, and an insulated gate bipolar transistor (IGBT) structure is formed in the active area.

11. The semiconductor device according to claim 1, wherein the second semiconductor area is formed in the mesh shape around a plurality of first conductivity type island regions arranged in a two-dimensional matrix.

12. The semiconductor device according to claim 1, wherein the mesh shape of the second semiconductor area has portions intersecting with each other.

13. A semiconductor device comprising:
- a semiconductor substrate made of silicon carbide in which an angle between a normal vector of a substrate surface and an orientation <0001> or <000-1> is 0° or more and 8° or less;
- a first conductivity type semiconductor layer made of silicon carbide formed on the semiconductor substrate;
- an active area formed on a surface of the semiconductor layer;
- a first semiconductor area of a second conductivity type having an impurity concentration and depth, formed on the surface of the semiconductor layer to surround the active area;
- a second semiconductor area, provided to adjoin an outer side of the first semiconductor area on the surface of the semiconductor layer and surround the first semiconductor area, in which a plurality of second conductivity type impurity areas having the same impurity concentration and the same depth as those of the first semiconductor area are arranged as strips intersecting each other and surrounding island regions of the first conductivity type semiconductor layer;
- a third semiconductor area of the second conductivity type formed around the first semiconductor area and the second semiconductor area and having a depth and impurity concentration;
- a first electrode provided on the active area; and
- a second electrode provided on a rear surface of the semiconductor substrate.

14. The semiconductor device according to claim 13, wherein
$\gamma$ denotes a relative permittivity of silicon carbide, $Ec_1$ and $Ec_2$ denote breakdown electric field intensities of silicon carbide in the orientation <0001> and <11-20>, respectively, and q denotes an electric charge elementary quantum, a depthwise integral value of the impurity concentration of the first semiconductor area is set to be 0.8 $\gamma Ec_1/q$ or more and 1.2 $\gamma Ec_1/q$ or less, and the value obtained by averaging the depthwise integral value of the impurity concentration of the impurity area within the second semiconductor area is 0.4 $\gamma Ec_2/q$ or more and 1.1 $\gamma Ec_2/q$ or less, and a depthwise integral value of the impurity concentration of the third semiconductor area is 0.4 $\gamma Ec_2/q$ or more and 1.1 $\gamma Ec_2/q$ or less.

\* \* \* \* \*